United States Patent [19]
Bax et al.

[11] Patent Number: 4,659,974
[45] Date of Patent: Apr. 21, 1987

[54] CONTROLLING ELECTRICAL PHASE CONNECTIONS TO A THREE-PHASE DEVICE

[75] Inventors: Anton M. Bax, Forthampton; Jonathan C. May, Weymouth, both of England

[73] Assignee: Smiths Industries Public Limited Company, London, England

[21] Appl. No.: 807,701

[22] Filed: Dec. 11, 1985

[30] Foreign Application Priority Data

Dec. 14, 1984 [GB] United Kingdom ............... 84 31691

[51] Int. Cl.$^4$ .............................................. H02P 7/36
[52] U.S. Cl. .................................... 318/806; 323/910; 361/77
[58] Field of Search ....................... 318/806, 798, 289; 361/77; 323/910

[56] References Cited

U.S. PATENT DOCUMENTS

| | | | |
|---|---|---|---|
| 3,708,719 | 1/1973 | Ishikawa . | |
| 3,848,165 | 11/1974 | Heiberger | 318/289 |
| 4,021,704 | 5/1977 | Norbeck | 361/77 |
| 4,163,270 | 7/1979 | Marus | 361/77 |
| 4,196,378 | 4/1980 | Shirai | 361/77 |
| 4,492,878 | 1/1985 | Hamel | 361/77 |
| 4,618,807 | 10/1986 | Wiessner et al. | 361/77 |

FOREIGN PATENT DOCUMENTS 1144188 3/1969 United Kingdom .
2116790B 6/1985 United Kingdom .

Primary Examiner—William H. Beha, Jr.
Attorney, Agent, or Firm—Pollock, Vande Sande & Priddy

[57] ABSTRACT

A control circuit is connected between a three-phase power supply and a motor and ensures the correct application of phase signals to the motor, regardless of the way in which the control circuit is connected to the power supply. A first output signal of the supply is connected directly to an input of the motor via the circuit. Supply of power to the other two inputs is controlled by four switches, two of which receive signals from the second supply output and have their outputs connected to respective motor inputs, and the other two of which receive signals from the third supply output and have their outputs connected to respective motor inputs. The switches are controlled such that two switches are on, and the other two switches are off if the third output signal is positive with respect to the first output signal when the second signal passes through zero with respect to the first signal in a positive sense.

11 Claims, 7 Drawing Figures

CONTROLLING ELECTRICAL PHASE CONNECTIONS TO A THREE-PHASE DEVICE

BACKGROUND OF THE INVENTION

This invention relates to circuits and to methods of controlling application of a three-phase supply to an electrical device.

The invention is more particularly, but not exclusively, concerned with ensuring that an electric motor receives the correct phase signals from a three-phase supply.

In many devices driven by a three-phase power supply, it is important that the correct phase outputs are connected to the correct inputs of the device. One example of this is in gyroscope apparatus employing hydrodynamic gas-lubricated bearings which are driven by an electric motor. If the motor is incorrectly connected, the bearings could be rotated in the wrong sense, thereby causing damage.

Although the outputs of three-phase power supplies are generally labelled, it is fairly common for this labelling to be incorrect. Also, despite correct labelling, the electrical device can still be wrongly connected to the power supply. This is especially a problem where the device is being installed by inexperienced technicians.

BRIEF SUMMARY OF THE INVENTION

It is an object of the present invention therefore to provide a circuit and a method which ensure that the device does not receive the incorrect phase inputs.

According to one aspect of the present invention, there is provided a circuit for ensuring correct application of a three-phase power supply to an electrical device, the circuit including three inputs for connection respectively to each phase output of the power supply, and three outputs for connection respectively to three phase inputs of the device, wherein the circuit is arranged to supply power to a first of the circuit outputs in phase with the power at a first of the circuit inputs, wherein the circuit includes: first, second, third and fourth switching means, said first and second switching means being connected in series between said second input and said second and third outputs respectively, said third and fourth switching means being connected in series between said third input and said second and third outputs respectively; means for producing an output response when the signal at the second input has a predetermined relationship with respect to the signal at the first input, means for determining the relationship of the signal at the third input relative to the signal at the first input on occurrence of said output response, and means for controlling operation of said switching means in accordance with the relationship of the signal at the third input relative to the signal at the first input on occurrence of said output response, such that either said first switching means and said fourth switching means, or said second switching means and said third switching means are rendered conductive, with the other two switching means being rendered non-conductive.

The output response may be produced when the signal at the second input passes through zero with respect to the signal at the first input.

The circuit may produce first and second output responses when the signal at the second input has respective first and second predetermined relationships with the signal at the first input, and the first output response controlling switching of the first and fourth switching means, and the second output response controlling switching of the second and third switching means. The first output response may be produced when the signal at the second input passes through zero in one sense with respect to the signal at the first input, and the second output response being produced when the signal at the second input passes through zero in the opposite sense with respect to the signal at the first input. The output response is preferably in the form of pulses, which may be spaced by 180°.

The circuit preferably includes a diode pump circuit, the pulses being supplied to the diode pump circuit. The pulses may charge a capacitor in the diode pump circuit, the capacitor being discharged when signals at the third input have a predetermined relationship with respect to signals at the first input. The circuit may include first and second diode pump circuits, the first diode pump circuit being supplied with a first output response in the form of first pulses, the second diode pump circuit being supplied with a second output response in the form of second pulses spaced from the first pulses by 180°, the first diode pump circuit being arranged to control switching of the first and fourth switching means, and the second diode pump circuit being arranged to control switching of the second and third switching means. Each diode pump circuit is preferably connected to an input of respective comparator means, switching of the switching means being controlled by the comparator means.

The circuit may include means for preventing all four switching means being rendered conductive at the same time. Preferably the circuit includes first and second comparator means arranged respectively to control switching of the first and fourth and the second and third switching means, and the first and second comparator means being arranged such that when one comparator means produces an output effective to render two of switching means conductive, output is supplied to an input of the other comparator means to prevent the other comparator means producing an output effective to render the other two of switching means conductive. Each switching means may include a triac or a diode bridge circuit.

According to another aspect of the present invention there is provided electrical apparatus including an electrical device in the form of a motor and a circuit according to the one aspect of the present invention arranged to ensure correct application of a three-phase power supply to the motor.

According to a further aspect of the present invention, there is provided gyroscope apparatus including a motor and a circuit according to the one aspect of the present invention.

According to yet another aspect of the present invention, there is provided a method of ensuring correct application of a three-phase power supply to an electrical device, including the steps of supplying a first of three three-phase signals directly to a first input of the device, determining when a second of the three-phase signals has a predetermined relationship with respect to the first signal, determining the relationship of the third signal relative to the first signal when said predetermined relationship exists, and controlling supply of the second and third signals to a second or a third input of the device in accordance with the relationship of the third signal to the first signal when the predetermined relationship exists.

An electrical motor system including a gyroscope motor, a power supply and a control circuit, in accordance with the present invention, will now be described, by way of example, with reference to the accompanying drawings.

DETAILED DESCRIPTION

Figure 1:
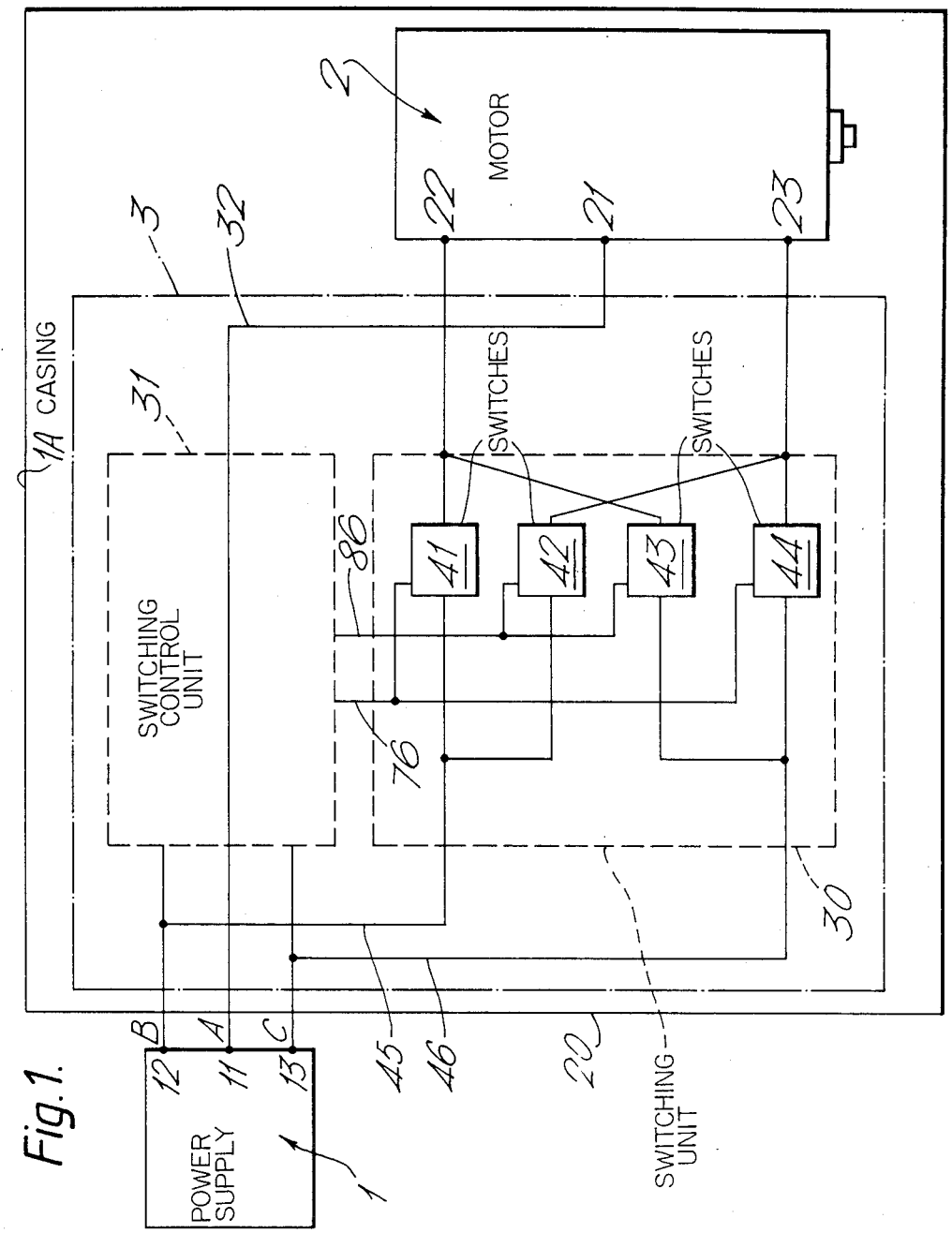
FIG. 1 shows the system schematically.

With reference to FIG. 1, the motor system comprises a three-phase power supply 1 that drives a motor 2 via a control circuit 3 all housed within casing 1A. The motor 2 is of a kind which must be driven in a predetermined sense and, for example, may be used to rotate a gyroscope inertia member mounted on hydrodynamic gas-lubricated bearings. The control circuit 3 is arranged to ensure that the three signals 'A', 'B' and 'C' supplied to the motor 2 always have the desired phase relationship with one another irrespective of the way in which the supply 1 is connected to the control circuit. The control circuit 3 is preferably mounted inside the same casing 20 containing the motor, as a factory-assembled unit, so that the unit may be subsequently connected to the power supply without any special precautions taken to ensure correct phase connection. In this respect, it has been found that, in many cases, three-phase power supplies have outputs that are incorrectly labelled; the control circuit 3 thereby ensures that the motor 2 is not damaged however the supply is connected.

The control circuit 3 comprises two basic units: a switching unit 30, and a switching control unit 31. Signals 'A' from one output 11 of the supply 1 pass directly to an input 21 of the motor 2, through the control circuit 3 on line 32. Signals 'B' and 'C' from the other two outputs 12 and 13 of the supply 1 are supplied to the other inputs 22 and 23 of the motor in accordance with their phase relationship with the signals 'A' from the output 11, as determined by the control circuit 3. In this respect, the switching unit includes four switches 41 to 44. Two of these switches 41 and 42 have their inputs connected in parallel to the second output 12 of the supply, via line 45, and have their outputs connected respectively to the second and third inputs 22 and 23 of the motor 2. The other two switches 43 and 44 are similarly connected in parallel to the third output 13 of the supply, via line 46, and have their outputs connected respectively to the second and third inputs 22 and 23 of the motor. The switches are controlled by the control unit 31 in one of two states. In one state, the two switches 41 and 44 are on, with the other two switches 42 and 43 off, so as to connect the signals 'B' from the second supply output 12 to the second motor input 22, and the signals 'C' from the third supply output 13 to the third motor input 23. In the other state, the switches 42 and 43 are on and switches 41 and 44 are off, so as to connect the signals 'B' from the second supply output 12 to the third motor input 23, and the signals 'C' from the third supply output 13 to the second motor input 22.

The switches 41 to 44 may employ triacs or a diode bridge circuit such as, for example, of the kind described in our co-pending patent application GB No. 85,22099.

Figure 2:
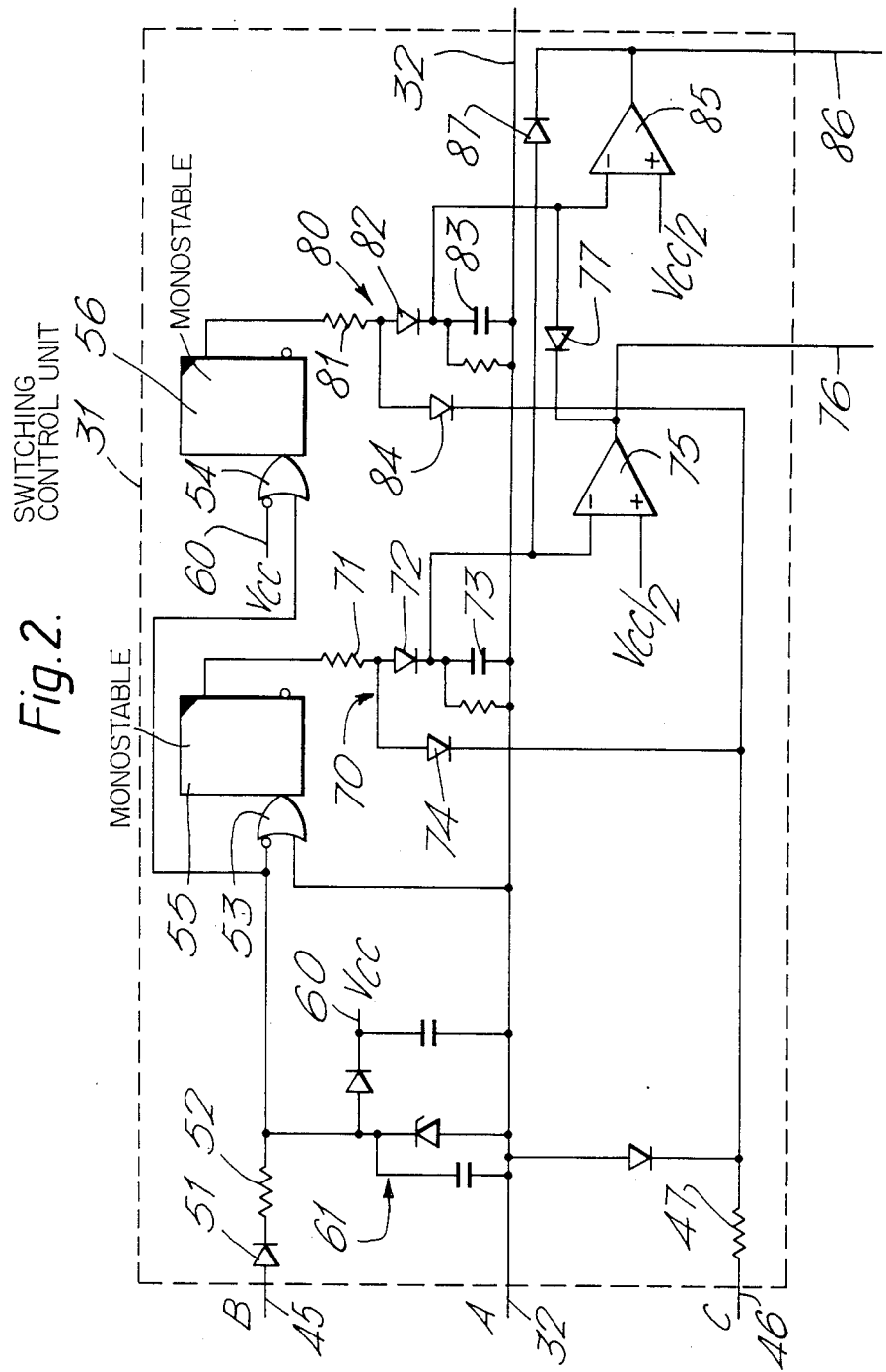
FIG. 2 illustrates the control circuit in more detail.

The construction of the switching control unit 31 will now be described in greater detail with reference to FIG. 2. As mentioned above, the line 32 from the first output terminal 11 of the supply extends through the unit 31 as a reference rail. The second output 12 of the supply 1 is connected via a diode 51 and current limiting resistor 52 both to the inverting input of a first OR gate 53 and to the non-inverting input of a second OR gate 54. The non-inverting input of the first OR gate 53 is connected to line 32, and its output is connected to a first monostable circuit 55. The inverting input of the second OR gate 54 is connected to a source of constant positive voltage Vcc on line 60, and its output is connected to a second monostable circuit 56. It should be pointed out here that the system is fully floating with respect to the signal 'A' at the first supply output 11 so that the two monostable circuits 55 and 56 respond to the signal 'B' at the second supply output 12 with respect to the signal 'A' at the first supply output.

The constant positive voltage Vcc is derived from a zener diode circuit 61 connected between lines 32 and 45.

The outputs of the monostable circuits 55 and 56 are connected to respective diode pump circuits 70 and 80. Each diode pump circuit 70 and 80 comprises a series circuit of a resistor 71 or 81, diode 72 or 82 and capacitor 73 or 83 connected between the monostable output and line 32. At the junction between the resistor 71 or 81 and the diode 72 or 82 there is connected a further diode 74 or 84, the anode of each further diode being connected to this junction and the cathode being connected to line 46 via a resistor 47 and the third supply output 13.

The output from each diode pump circuit 70 and 80 is taken from the junction between the diode 72 or 82 and the capacitor 73 or 83, and is connected to the negative input of a respective comparator 75 or 85. The positive input of each comparator 75 or 85 is connected to a source of constant positive voltage Vcc/2. The outputs of the comparators 75 and 85 are connected to output lines 76 and 86 respectively of the control unit 31 which extend to the switching unit 30. The output of each comparator 75 and 85 is also connected to the negative input of the other comparator via a respective diode 77 or 87, each diode having its cathode connected to the comparator output.

The operation of the system will now be described with reference also to FIGS. 3 to 7.

Figure 3:
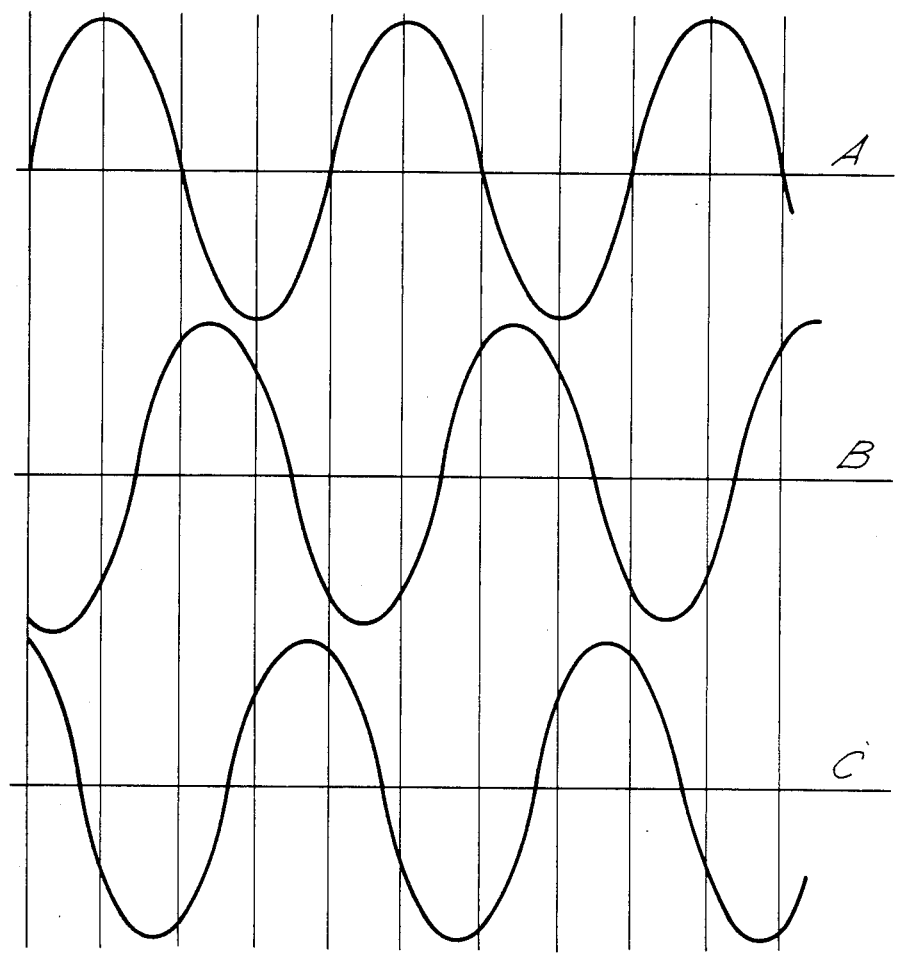
FIG. 3 shows the three output signals from the power supply.
Figure 4:
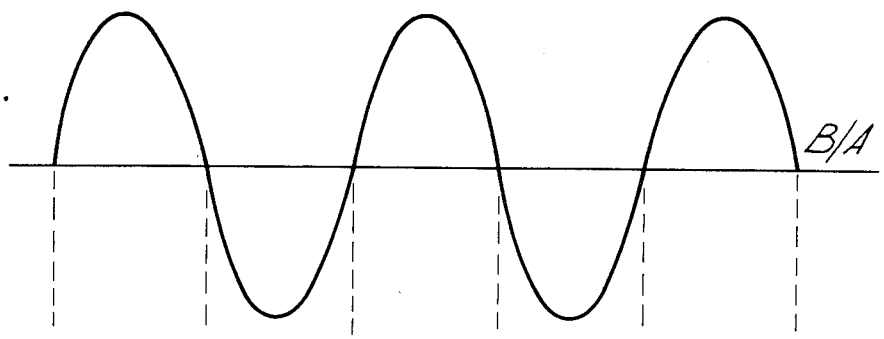
FIG. 4 shows the relationship of two of the output signals with respect to each other.
Figure 5:
FIGS. 5 and 6 show signals from two parts of the control circuit.
Figure 6:
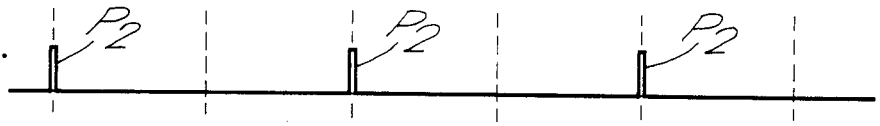

The signals from the three outputs 11 to 13 of the supply 1 take the form of sinewave signals with a 120 degree phase difference between them, as shown in FIG. 3. Because the system is fully floating with respect to one of the outputs, that is the signal 'A' at the first output 11 on line 32, the OR gate 53 opens to cause switching of the first monostable unit 55 when the value of the second signal 'B' relative to the first signal 'A' as shown in FIG. 4, passes through zero in a negative sense. The output from the first monostable unit 55 is a short pulse $P_1$ as shown in FIG. 5. Similarly the second monostable unit 56 produces a short output pulse $P_2$ when the value of the signal 'B' relative to the first signal 'A' passes through zero in a positive sense, as shown in FIG. 6. The pulses $P_1$ and $P_2$ each have a spacing of 360 degrees and are spaced from each other by 180 degrees.

Figure 7:
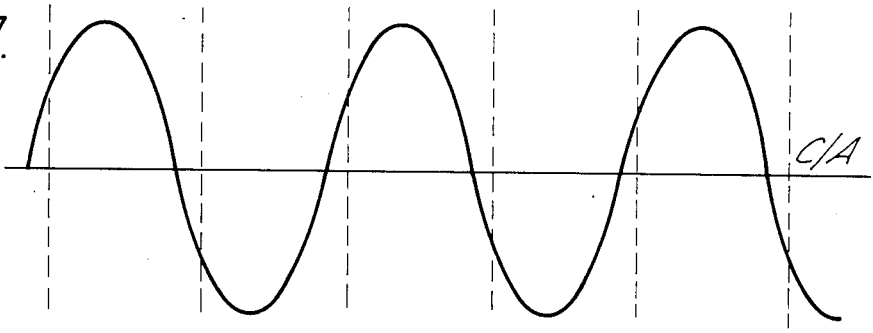
FIG. 7 shows the relationship of another two of the output signals with respect to each other.

These pulse outputs $P_1$ and $P_2$ are supplied to charge the capacitors 73 and 83 respectively in the diode pump circuits 70 and 80. The diode pump circuits 70 and 80 are, however, also controlled by the third signal 'C' on line 46, or rather, the value of the third signal 'C' relative to the first signal, as shown in FIG. 7. For the signal shown in FIG. 7, it is clear that during pulses $P_1$ from the first monostable unit 55, the signal C/A is negative, whereas during pulses $P_2$ from the second monostable unit 56 this output is positive. The diode 74 in the first diode pump circuit 70 is therefore rendered conductive, preventing the pulses from the first monostable circuit 55 charging the capacitor 73. Similarly, the diode 84 in the second diode pump circuit 80 will be non-conductive so pulses $P_2$ from the second monostable 56 will charge the capacitor 83 to a value Vcc.

The signal at the negative input of the first comparator 75 is therefore zero and its output on line 76 is therefore high, whereas the signal at the negative input of the second comparator 85 is Vcc and its output on line 86 is therefore low.

With reference now again to FIG. 1, it will be seen that the control inputs to switches 41 and 44 are high and the control inputs to switches 42 and 43 are low. The switches are arranged to be nonconductive with a high control input and conductive with a low control input. The switches 41 and 44 are therefore off, switches 42 and 43 being on. In this way, the signals 'B' from the second output 12 of the supply 1 are connected to the third input 23 of the motor 2, the signals 'C' from the third output 13 of the supply being connected to the second input 22 of the motor.

It will be appreciated that, if the phase of the third signals 'C' with respect to the first signals 'A' was displaced by 120 degrees with respect to that shown in FIG. 7, the outputs on the two output lines 76 and 86 would be reversed, line 76 being low and line 86 being high. This would cause the switching unit to connect the second signals 'B' instead to the second motor input 22, and the third signals 'C' to the third motor input 23, thereby ensuring that the phase of the signals supplied to the inputs of the motor always have the correct relationship with one another.

The circuit described above operates by determining the phase relationship between a first and second of the supply outputs and, when a predetermined phase relationship exists (such as zero crossing), the phase relationship between the third output and the second output is determined. This latter phase relationship is used to control switching of the second and third outputs to appropriate inputs of the motor or other device.

The use of diodes 77 and 87 ensures that on the initial application of power to the circuit, only one comparator 75 or 85 can operate, the other comparator being held with a high output. This ensures that any noise on the lines 45 or 46 cannot immediately change the switching states without the first comparator output going high again, thereby giving the circuit degree of immunity to noise. The arrangement makes it very difficult for both lines 76 and 86 to go low together and thereby prevents all four switches 41 to 44 being rendered conductive at the same time.

What I claim is:

1. A circuit for ensuring correct application of three phase outputs of a three-phase power supply to three phase inputs of an electrical device, the circuit comprising: three inputs, said three inputs being adapted for connection respectively to each phase output of the power supply; three outputs, said three outputs being adapted for connection respectively to said three phase inputs of the device; means for supplying power to a first of said circuit outputs in phase with the power at a first of said circuit inputs; first, second, third and fourth switching means; means connecting said first and second switching means in series between said second circuit input and said second and third circuit outputs respectively; means connecting said third and fourth switching means in series between said third circuit input and said second and third circuit outputs respectively; means for producing two sets of output pulses when the signal at the second circuit input has two respective different predetermined relationships with respect to the signal at the first circuit input; means for determining the relationship of the signal at the third circuit input relative to the signal at the first circuit input on occurrence of a pulse in said two sets of output pulses; switching control means for controlling operation of said switching means in accordance with said two sets of output pulses; and means for inhibiting supply of one or other of said two sets of output pulses to said switching control means in accordance with the relationship of the signal at the third circuit input relative to the signal at the first circuit input on occurrence of a pulse in the respective sets of output pulses, such that either said first switching means and said fourth switching means, or said second switching means and said third switching means are rendered conductive, with the other two switching means being rendered non-conductive.

2. A circuit according to claim 1, wherein said circuit produces said two sets of output pulses when the signal at the second circuit input passes through zero with respect to the signal at the first circuit input.

3. A circuit according to claim 2, wherein the circuit produces said first set of output pulses when the signal at the second circuit input passes through zero in one sense with respect to the signal at the first circuit input, and wherein the circuit produces said second set of output pulses when the signal at the second circuit input passes through zero in the opposite sense with respect to the signal at the first input.

4. A circuit according to claim 1, wherein said switching control means includes two diode pump circuits, each diode pump circuit having an input and an output, and means connecting each said diode pump circuit input to receive respective sets of output pulses.

5. A circuit according to claim 4, wherein each said diode pump circuit includes a capacitor and means for supplying said pulses to charge the capacitor, and means for discharging said capacitor when signals at said third circuit input have a predetermined relationship with respect to signals at the first circuit input.

6. A circuit according to claim 4, wherein said first diode pump circuit controls switching of said first and fourth switching means, and wherein said second diode pump circuit controls switching of said second and third switching means.

7. A circuit according to claim 5, including comparator means and means for connecting each said diode pump circuit to an input of respective comparator means, and wherein said comparator means controls switching of the switching means.

8. A circuit according to claim 4, including first and second comparator means, each said comparator means having two inputs and an output, means connecting one input of each said comparator to respective ones of said diode pump circuits, means connecting the output of each said comparator means respectively to the first and fourth and the second and third switching means such as to control switching thereof, and wherein the first and second comparator means are interconnected such that when one comparator means produces an output effective to render two of said switching means conductive, said output is supplied to an input of the other comparator means to prevent the other comparator means producing an output effective to render the other two of said switching means conductive.

9. A circuit for ensuring correct application of three phase outputs of a three-phase power supply to three phase inputs of an electrical device, the circuit comprising: three inputs, said three inputs being adapted for connection respectively to each phase output of the power supply; three outputs, said three outputs being adapted for connection respectively to said three phase inputs of the device; means for supplying power to a first of said circuit outputs in phase with the power at a first of said circuit inputs; first, second, third and fourth switching means; means connecting said first and second switching means in series between said second circuit input and said second and third circuit outputs respectively; means connecting said third and fourth switching means in series between said third circuit input and said second and third circuit outputs respectively; first monostable circuit means; means connecting said first monostable circuit means to receive the signal at the second circuit input and the signal at the first circuit input, said first monostable circuit means being arranged to produce a first output pulse when the signal at the second circuit input passes through zero in one sense with respect to the signal at the first circuit input; second monostable circuit means; means connecting said second monostable circuit means to receive the signal at the second circuit input and the signal at the first circuit input, the second monostable means being arranged to produce a second output pulse when the signal at the second circuit input passes through zero in the opposite sense with respect to the signal at the first circuit input; first and second diode pump circuits; means connecting said first and second diode pump circuits to respective ones of said first and second monostable circuit means; means connecting said first and second diode pump circuits to receive the signal at said third circuit input, such that the first and second diode pump circuits thereby produce respective first and second output signals in accordance with whether the signal at the third circuit input is positive or negative with respect to the signal at the first circuit input when the signal at the second circuit input passes through zero with respect to the signal at the first circuit input in two different senses; and means for controlling operation of said switching means in accordance with the outputs of said first and second diode pump circuits such that either said first switching means and said fourth switching means, or said second switching means and said third switching means are rendered conductive, with the other two switching means being rendered non-conductive.

10. Electrical apparatus including an electric motor and a circuit for ensuring correct application of three phase outputs of a three-phase power supply to three phase inputs of the motor, the circuit comprising: three inputs, said three inputs being adapted for connection respectively to each phase output of the power supply; three outputs, said three outputs being adapted for connection respectively to the said three phase inputs of the motor; means for supplying power to a first of the said circuit outputs in phase with the power at a first of said circuit inputs; first, second, third and fourth switching means; means connecting said first and second switching means in series between said second circuit input and said second and third circuit outputs respectively; means connecting said third and fourth switching means in series between said third circuit input and said second and third circuit outputs respectively; means for producing two sets of output pulses when the signal at the second circuit input has two respective different predetermined relationships with respect to the signal at the first circuit input; means for determining the relationship of the signal at the third circuit input relative to the signal at the first circuit input on occurrence of a pulse in said two sets of output pulses; switching control means for controlling operation of said switching means in accordance with said two sets of output pulses, and means for inhibiting supply of one or other of said sets of output pulses to said switching control means in accordance with the relationship of the signal at the third circuit input relative to the signal at the first circuit input on occurrence of a pulse in the respective sets of output pulses, such that either said first switching means and said fourth switching means, or said second switching means and said third switching means are rendered conductive, with the other two switching means being rendered non-conductive.

11. Electrical apparatus according to claim 10, including a casing, and wherein the said circuit and motor are contained within said casing.

* * * * *